United States Patent [19]

Catiller et al.

[11] Patent Number: 4,713,608

[45] Date of Patent: Dec. 15, 1987

[54] APPARATUS FOR PROVIDING COST EFFICIENT POWER MEASUREMENT

[75] Inventors: Robert D. Catiller, Garden Grove; John D. Faivre, Glendora; Fah Rakpongs, Lakewood, all of Calif.

[73] Assignee: Computer Power Systems Corporation, Carson, Calif.

[21] Appl. No.: 840,606

[22] Filed: Mar. 6, 1986

[51] Int. Cl.$^4$ ................. G01R 21/06; G01R 19/00
[52] U.S. Cl. ................................. 324/142; 324/140 R; 364/483
[58] Field of Search ............... 364/483, 701, 754, 761; 328/160, 161; 324/142, 127

[56] References Cited

U.S. PATENT DOCUMENTS

| | | | |
|---|---|---|---|
| 3,975,682 | 8/1976 | Mayfield | 324/142 |
| 3,976,942 | 8/1976 | Mayfield | 324/142 X |
| 4,055,804 | 10/1977 | Mayfield | 324/123 R X |
| 4,056,775 | 11/1977 | Milkovic | 324/142 X |
| 4,058,768 | 11/1977 | Milkovic | 324/142 X |
| 4,066,960 | 1/1978 | Milkovic | 364/483 X |
| 4,118,787 | 10/1978 | Arnoux | 364/483 X |
| 4,217,546 | 8/1980 | Milkovic | 324/142 X |
| 4,276,605 | 6/1981 | Okamoto et al. | 364/483 X |
| 4,303,881 | 12/1981 | Czerwien et al. | 324/142 X |
| 4,333,118 | 6/1982 | Comstedt et al. | 324/142 X |
| 4,456,878 | 6/1984 | Gamoh | 324/142 X |
| 4,485,343 | 11/1984 | Milkovic | 324/142 X |
| 4,495,463 | 1/1985 | Milkovic | 324/142 X |
| 4,504,787 | 3/1985 | Planer | 324/142 X |
| 4,535,287 | 8/1985 | Milkovic | 324/142 X |
| 4,577,279 | 3/1986 | Salowe | 364/483 X |

Primary Examiner—Reinhard J. Eisenzopf
Assistant Examiner—Vinh P. Nguyen
Attorney, Agent, or Firm—Irving Keschner

[57] ABSTRACT

Power measuring apparatus including a first multiplexor having its inputs responsive to the polyphase voltage and current inputs being measured. The multiplexor reads these inputs in sequence based on address signals provided by a program controlled microprocessor. The output of the multiplexor is coupled to an RMS to DC converter, the output of which is coupled to a second multiplexor. The voltage inputs are coupled to a voltage averaging device, the output thereof being coupled to additional inputs of the second multiplexor, the output of the second multiplexor being coupled to the microprocessor via an analog to digital converter. The microprocessor reads and compares the voltage output from the averaging circuit and the corresponding voltage at the output of the converter and generates a correction factor and responds thereto. The microprocessor to periodically adjusts the digital value of the voltage from the averaging circuit in response to the correction factor, the adjusted signal being coupled to display means for visual readout.

A third multiplexor is provided to detect polyphase voltages and currents. The outputs of the third multiplexor are coupled under the control of the microprocessor to an analog multiplier in a time shared manner via voltage and currents scaling devices such that each phase voltage and corresponding current is simultaneously coupled to the multiplier. The output of the multiplier is coupled to a low pass filter, the output of which corresponds to the kilowatt power consumed for that phase. The microprocessor is capable of calculating a system power factor.

36 Claims, 7 Drawing Figures

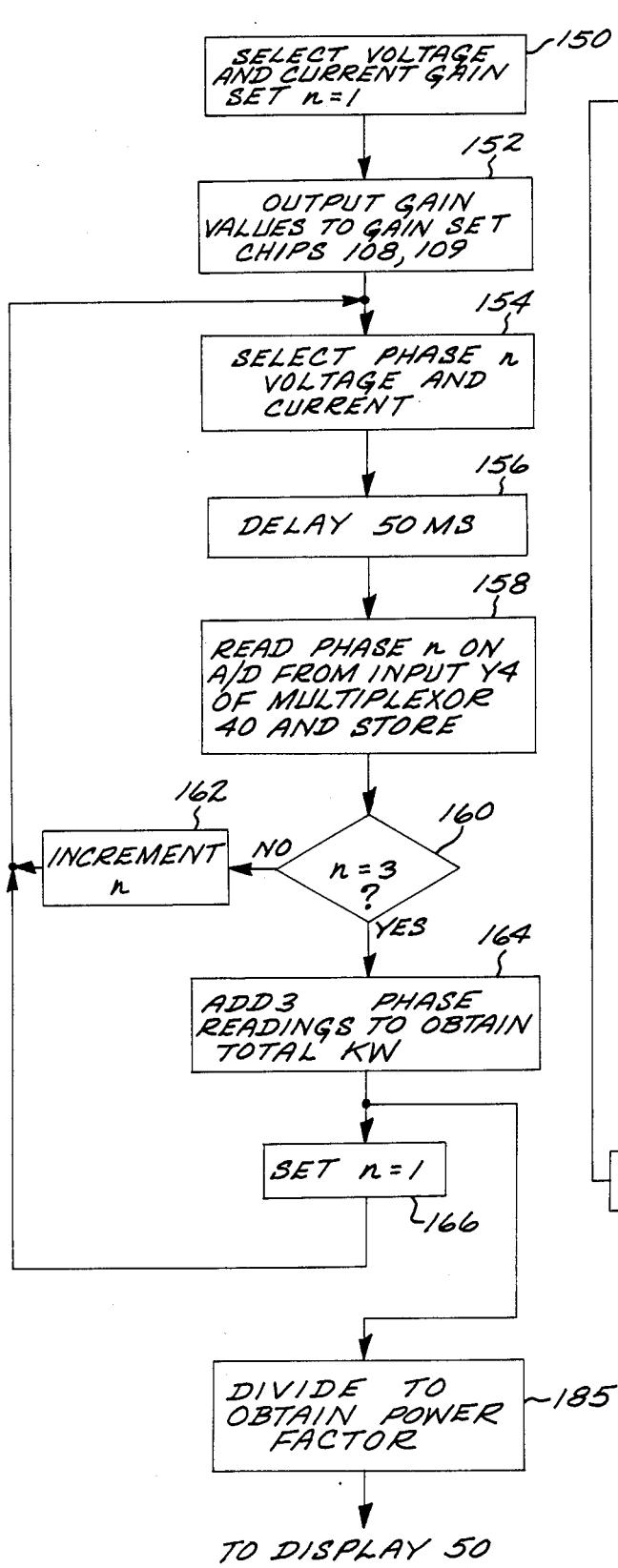
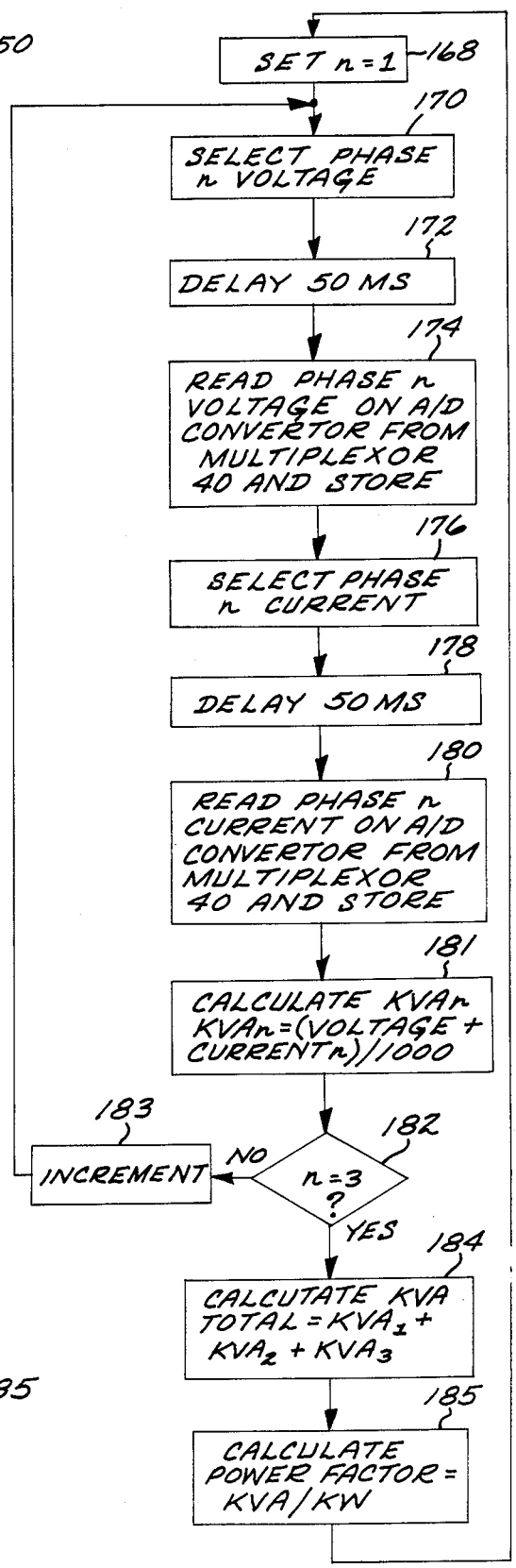
FIG. 4A
FIG. 4B

APPARATUS FOR PROVIDING COST EFFICIENT POWER MEASUREMENT

BACKGROUND OF THE INVENTION

1. Field of the Invention

The present invention relates to an improved technique of measuring power provided by a polyphase current/voltage source, the power being supplied to an utilization system.

2. Background of the Invention

Apparatus for measuring electrical power supplied by an A-C polyphase power source to a load have long been available in the prior art. Typical of these prior art apparatus are those disclosed in the following United States patents:

U.S. Pat. No. 3,975,682 discloses a watt/watthour meter wherein a current proportional to instantaneous power is obtained from a current voltage multiplier circuit, the current being integrated to provide a watthour output signal. A charge compensation circuit is provided to integrate one of the watt signal currents in either direction corresponding to power in or power out to minimize the error in the integrating section of the watt/watthour meter; U.S. Pat. No. 3,976,942 is similar to that of U.S. Pat. No. 3,975,682 with the pulse width modulator utilized in the multiplier modified to provide two current outputs instead of a voltage to minimize system errors in power measurements; U.S. Pat No. 4,055,804 is similar to U.S. Pat. Nos. 3,975,682 and 3,976,942 except that the power related current output signal of the modulator is amplified by a current-to-amplifier instead of a voltage amplifier; U.S. Pat. No. 4,066,960 relates to an electronic kilowatt hour meter having internal error correction for metering electrical power and energy consumption in a single phase or polyphase electrical system. A pulse width modulated signal having a pulse duration proportional to the amplitude of the voltage in the system is multiplied by a signal which is proportional to the current in the system. The output of the multiplier is integrated to provide a signal which is proportional to the energy consumed in the system; U.S. Pat. No. 4,056,775 discloses a technique for metering kilowatt hours in an electrical system by generating pairs of analog signals representing current and voltage variables, the basic circuitry for metering kilowatts and kilowatt hours being similar to that disclosed in U.S. Pat. No. 4,066,960; U.S. Pat. No. 4,058,768 discloses a two-way electronic kilowatt meter for metering electrical power and energy consumption in a single phase or polyphase system. Pairs of analog signals representing current and voltage variables are derived, each pair of analog signals being multiplied together to derive partial instantaneous power signals. These signals are summed and integrated to provide a signal which is proportional to the total energy being imported or exported with respect to the electrical system; U.S. Pat. No. 4,217,546 discloses an electronic energy consumption meter and system which includes means for automatically correcting for overall system signal and voltage errors and offset errors created by circuits in the system; U.S. Pat. No. 4,485,343 describes an electronic watthour and watt meter circuit providing both analog and digital outputs and having an automatic error correction and utilizes first and second input transformers for developing first and second signals proportional respectively to the voltage and current being supplied from a source of electrical energy to a consumer. The first and second signals are supplied to a multiplier circuit for developing pulse-width-modulated and amplitude modulated product output signals representative of instantaneous watts. Automatic error correction is provided wherein automatic addition/subtraction averaging of system offset error signals during operation is accomplished; U.S. Pat. No. 4,495,463 discloses an electronic watt and kilowatt hour measuring circuit and uses a current transformer sensor for sensing alternating load current and a voltage transformer for sensing the alternating current voltage supplied from a source of alternating current electric current energy being monitored; U.S. Pat. No. 4,535,287 discloses an electronic watt-watthour meter circuit which comprises first and second transformers for developing first and second voltage and current indicating signals for supply to a multiplier circuit that multiplies the two signals together and derives an output analog product signal representative of the instataneous power being supplied by a source of electric energy; U.S. Pat. No. 4,456,878 describes an electronic watthour meter which includes a pulse width modulation circuit for converting a voltage signal proportional to the load voltage across the power supply lines to a pulse width duty cycle signal and a current to voltage converter for converting a current signal proportional to the load current across the power supply lines to a voltage signal. The multiplication circuit provides a product of the voltage signals as a signal proportional to the instantaneous power consumption of the power supply lines; U.S. Pat. No. 4,408,283 relates to a power evaluating apparatus such as power transducers utilizing a time division multiplication approach and providing a phase adjustment which adjusts for reactive power and energy measurement; U.S. Pat. No. 4,303,881 discloses a device for providing multiple functions including the measurement of power which is done by measuring the voltage and current from line voltage and current voltage samples and applying them to a scaled multiplier, the output of the multiplier providing an indication of true power; U.S. Pat. No. 4,118,787 discloses an error correcting device for a multiplier of the time-division multiplication type comprising a modulator, a switch and a filter; and U.S. Pat. No. 4,333,118 discloses a load indicator for AC motors which has an analog multiplying circuit for producing a signal proportional to the product of the current of the motor and the voltage thereof. From this signal a signal is subtracted which is proportional to the absolute value of the motor current, the average value of the differential signal being a measure of the load of the motor.

Although the aforementioned patents disclose various apparatus/techniques for measuring electrical power, concepts for reducing the cost/complexity thereof have not been specifically addressed. In particular, existing methods of measuring power supplied by a multiplier line (3 phase) power source to a load typically requires in the measuring circuit at least three separate RMS to DC chips to provide a measure of apparent power supplied over each of the three power input lines and three separate chips, such as low pass filters, to provide output signals representing the actual power consumed in the system. The necessity of thus using these additional chips to provide a power measurement adds to the cost of the overall apparatus. In the competitive business of providing power measuring apparatus, the vendor which can provide a device which measures power accurately and at a reduced cost would have an advantage over his competitors. Thus what is desired is to provide an apparatus which provides an indication of the actual and apparent power consumed by a system which is provided power by a polyphase distribution system, the measurement being accurate and accomplished at a cost which is significantly less than those of the prior art apparatus.

SUMMARY OF THE PRESENT INVENTION

The present invention provides an apparatus for measuring both true and apparent power provided to a power utilization system, the measurements being accomplished faster and more accurately than in prior art apparatus and at a cost lower than that achieved by power measurement apparatus now available.

The apparatus incorporates a first multiplexer having its inputs responsive to the polyphase voltage and current inputs being measured. The multiplexor reads these inputs in sequence based on address signals provided, in a preferred embodiment, by a program controlled microprocessor. The output of the multiplexor is coupled to an RMS to DC converter, the output of which is coupled to a second multiplexor. The voltage inputs are coupled to a voltage averaging device designed to respond to high speed events, the outputs being coupled to additional inputs of the second multiplexor, the output of the second multiplexor being coupled to the microprocessor via an analog to digital converter. The microprocessor sequentially reads and compares the voltage outputs from the averaging cicuits and the corresponding voltage at the output of the converter, and generates a correction factor in response thereto. The microprocessor is programmed to periodically adjust the digital value of the voltage from the averaging circuit in response to the correction factor, the adjusted signal being coupled to display means for a visual readout by a system user.

The apparatus further incorporates a three phase kilowatt metering circuit which utilizes a third multiplexor to detect the polyphase voltages and currents. The outputs of the third multiplexor are coupled under the control of the microprocessor to an analog multiplier in a time shared manner via voltage and current scaling devices such that each phase voltage and corresponding current is simultaneously coupled to the multiplier. The output of the third multiplexor is coupled to a low pass filter, the output of which corresponds to the actual kilowatt power consumed for that phase. The output of the filter is coupled to the second multiplexor, this output being sequentially read. The microprocessor is capable of multiplying the measured voltage and current RMS values together to provide a measure of apparent system power which is then divided into the filter output to provide the system power factor.

The present invention thus utilizes the concepts of time sharing and microprocessor programming to provide a system which measures power in a more cost effective, quicker and accurate manner then heretofore provided by currently available power measurement apparatus. The time sharing aspect of the invention in essence reduces the number of relatively costly RMS converter chips necessary for the apparatus to perform its function i.e. only one is necessary compared to the usual three identical chips necessary in prior art polyphase power measurement apparatus. Further, the use of the voltage/current scaling devices instead of the costly transformers normally utilized to step down the voltages/currents received from the initial power distribution source further reduces the cost of the apparatus.

The present invention also allows the use of relatively inexpensive averaging circuits, which respond faster to high speed events than RMS to DC convertors, to provide average voltages while using the accuracy provided by the RMS to DC convertor chip circuit measurement.

BRIEF DESCRIPTION OF THE DRAWING

For better understanding of the present invention as well as other objects and further features thereof, reference is made to the following description which is to be read in conjunction with the accompanying drawing wherein:

FIGS. 4–6 are flow charts of the microprocessor software utilized in the preferred embodiment of the apparatus of the present invention.

DETAILED DESCRIPTION OF THE INVENTION

Figure 1:
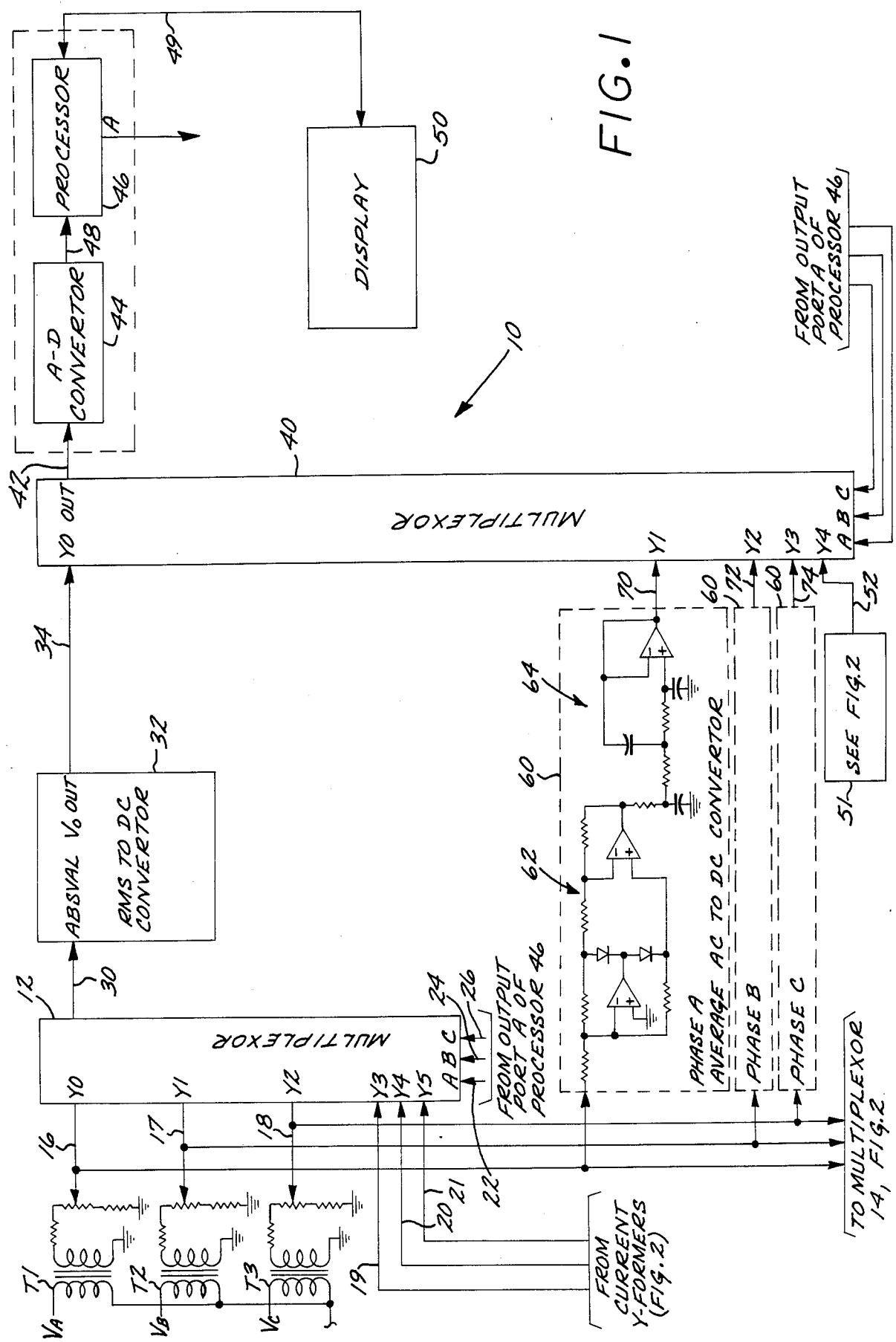
FIG. 1 is a schematic block diagram of the apparatus of the present invention.
Figure 2:
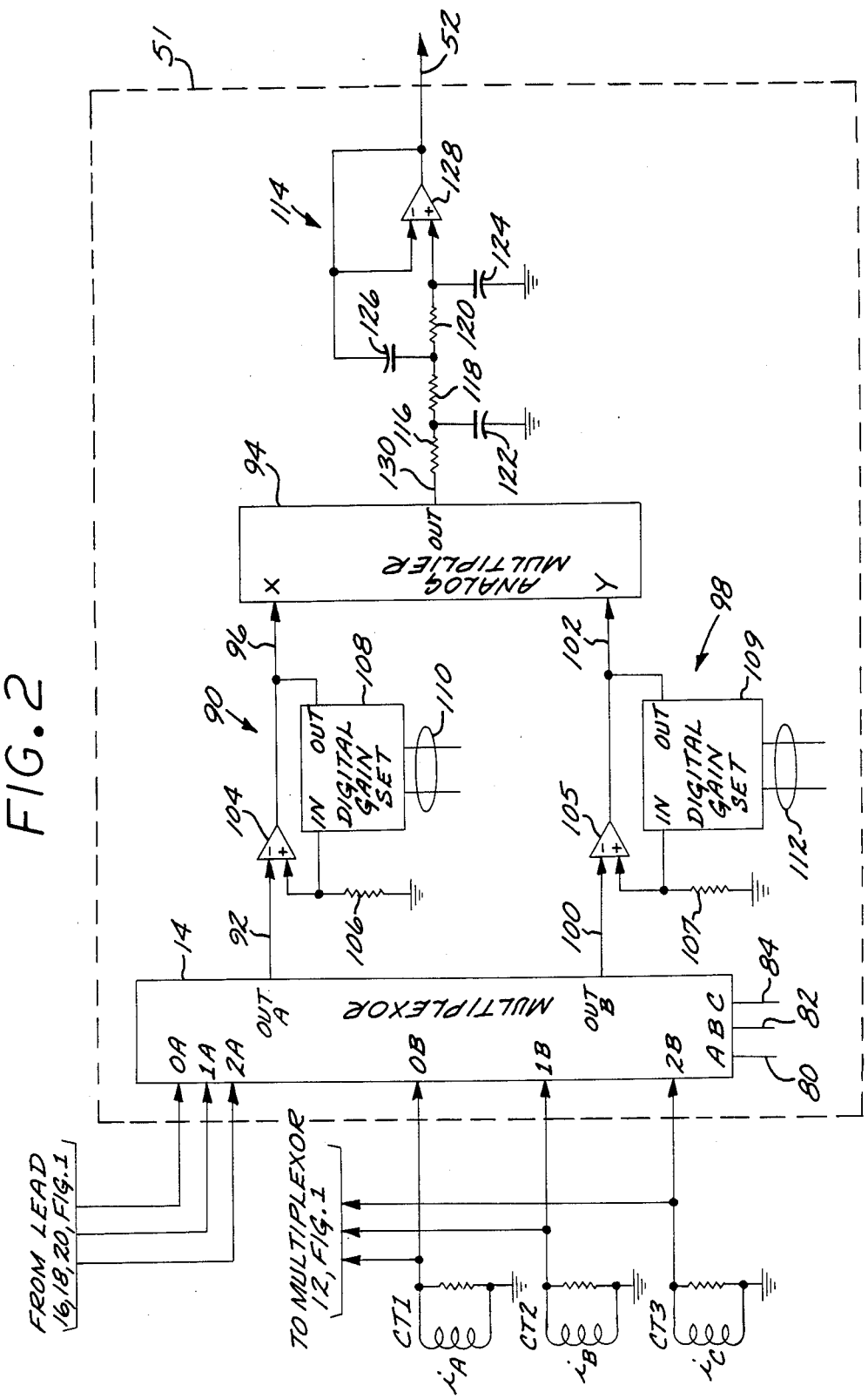
FIG. 2 is a schematic block diagram of the three phase kilowatt metering portion of the apparatus shown in FIG. 1.

Referring now to FIGS. 1 and 2, a block diagram of the preferred embodiment of apparatus 10 of the present invention is illustrated. The electrical system in which the power consumption is being measured by the apparatus of the present invention may be of any type including, for example, a conventional 60 Hz power distribution system. Further, the apparatus can be used with a single phase or polyphase system with the preferred embodiment of the apparatus being capable of measuring power in a polyphase system. The voltage $V_A$ in one phase of the electrical system is detected by means of a potential transformer T1 while the current $i_1$ in this phase of the system is detected by means of current transformer CT1 (FIG. 2). In the schematic representations shown, the voltages applied to multiplexors 12 and 14 are stepped-down versions of the actual voltages and currents applied to the system. For example, if the voltage applied to the system on one phase is 120 volts RMS, the voltage $V_A$ (and voltages $V_B$ and $V_C$ from the second and third phases) applied to the multiplexors 12 and 14 are typically in the range from 5 or 6 volts RMS due to the action of the voltage transformer T1. Similarly, the currents applied to the system typically are in the range from 0 to 700 amperes, whereas the stepdown voltage $i_A$ applied to multiplexor 14 (and currents $i_B$ and $i_C$) is in the range from 0 to about 5 volts due to the operation of current transformer CT1 and its load resistors the symbols i, i and i, thus representing voltages when applied to multiplexor 14. It should be noted that the detailed description of the apparatus hereinafter will refer to one phase and its associated circuitry since the circuitry is identical for each phase. The output of voltage transformers T1, T2 and T3 and current transformers CT1, CT2 and CT3 are coupled to three of the inputs of multiplexor 12 via leads 16,17, . . . 21, respectively. Multiplexors of the type illustrated by reference numeral 12 typically scan the voltages applied to their inputs under the control of signals applied to ports A,B and C by a processor or control system, the control signals being applied to leads 22, 24, 26 as illustrated. It is further noted that the currents $i_A$, $i_B$, $i_C$ applied to the inputs of multiplexor 12 and 14 are actually in the form of voltages which are porportional to the detected currents. In the actual embodiment of the invention which has been reduced to practice, multiplexor 12 is RMS multiplexor semiconductor chip LF13509 manufactured by National Semiconductor Corporation. Although a National Semiconductor multiplexor chip was utilized, similar functional chips provided by other manufacturers can be utilized instead. In the embodiment illustrated, the output of multiplexor 12 appears on lead 30 which is coupled to an RMS to DC converter 32. In the working embodiment of the apparatus shown in FIG. 1, RMS to DC converter 32 comprises Analog Devices chip AD536 although, as indicated with reference to the multiplexor chip 12, chips or circuits of other manufacturers performing the same function can be utilized. The output of converter 32 appearing on lead 34 is coupled to multiplexor chip 40, such as the RCA 4051 high speed multiplexor chip. The output of multiplexor 40 appearing on lead 42 is coupled to an analog to digital converter 44 such as the National ADC 1205 chip (this chip may be part of the processor board as noted hereinafter) as illustrated. The output of analog to digital converter 44 in turn is coupled to a processor means 46 via lead 48, processor means 46, in the preferred embodiment, comprising a microprocessor chip such as the Hitachi HD64B180 microprocessor chip. Other microprocessor chips or sequencing logic can be utilized in lieu of the HD64B180 chip. This chip, it should be noted, is part of a processor (microcomputer) board which includes two 16 channel analog to digital converters, I/O ports, memory chips, power supply chips, communication interface chips and appropriate interface circuitry which will be described in more detail hereinafter with reference to FIG. 3. In the representation shown in FIG. 1, at least one of the outputs from processor means 46 which appears on lead 48 is coupled to a display device 50, such as the Hitachi LCD Display LM018, which provides a plurality of visual output readings such as the actual and apparent power consumed by the system and an accurate approximation of the three phase RMS voltages to provide a visual indication of system alarm conditions. These readings are generally required by users of the apparatus of the present invention. One of the outputs of the processor means 46 is also coupled to multiplexor 40 via the output port A as the high speed multiplexor address to control the sequencing of the inputs applied thereto. One of the inputs applied to multiplexor 40 that appears on lead 52 is generated by a device 51, shown in more detail in FIG. 2, which provides an analog signal representing the actual kilowatts consumed by the system.

A plurality of devices 60 are provided to measure the average voltage on input voltage leads 16,18 and 20. In particular, each device 60 is a conventional circuit which comprises a full wave rectifier 62 and filter 64 arrangement whereby the RMS voltages on leads 16,18 and 20 are rectified and filtered to provide a DC voltage on leads 70, 72 and 74 corresponding to the dc equivalents of the average ac voltage value. These voltages are in turn applied to the appropriate inputs of multiplexor 40.

In operation, the RMS voltages applied to the power consuming load, such as a computer based system, is detected by a DIP switch/stepdown transformer arrangement which in essence converts the 120 volt RMS voltages into scaled down voltages applied to leads 16,17 and 18. The voltages on leads 16,17 and 18 are simultaneously applied to average voltage devices 60 and coupled to three of the inputs of multiplexor 40. The input sequencing of multiplexor 12, as noted hereinabove, is under control of the processor means 46 via the address signals applied to lead 22, 24 and 26 via output port A in a conventional manner and as further set forth in the flow charts illustrated in FIGS. 4–6. In a typical sequence of events, multiplexor 12 is caused to scan the input voltages on leads 16, 17, and 18, in sequence, the output being applied to RMS to DC converter 32 in the same sequence via lead 30. As illustrated by FIG. 1, the average values of the voltages $V_A$, $V_B$ and $V_C$ are simultaneously (in a parallel mode) applied directly to multiplexor 40 via AC to DC convertors 60. In essence, the averaging devices 60 respond to high speed events, devices 60 typically responding to the voltages on leads 16,17 and 19 in a 50 millisecond cycle. The RMS to DC converter 32, which provides an accurate measurement, responds slower to the voltage signals applied to its input, typically taking 300 milliseconds to provide an output readable on lead 34. In one aspect of the present invention, each voltage signal on leads 70, 72 and 74 is typically scanned three times before the corresponding output on lead 34 is scanned (read), the output as set forth hereinafter being averaged by the processor means 46 to provide an accurate representation of the average voltage on that lead by the time the corresponding output is read on lead 34. The last voltage signal scanned by multiplexor 40 is the output applied to the multiplexor via lead 52 which corresponds to the actual kilowatts being consumed by the system. Regarding the voltage measurement, the output voltages appearing on leads 34, 70,72 and 74 are coupled by the multiplexor 40 to analog to digital converter 44 which provides a digital signal on lead 48 to the processor, or control, means 46. In the case of the desired voltage measurement, processor means 46, which in the preferred mode comprises a program controlled microprocessor, is programmed to measure the average voltage and the dc voltage corresponding to the RMS value for each phase and to provide a correction factor by generating a signal representing the ratio of these two values. In other words, the average voltage which, as noted hereinabove responds to high speed events, is constantly updated by the more accurate measurement provided at the output of RMS/DC converter 32 by the correction factor such that an output corresponding to the RMS voltage for each phase is provided on lead 49 to display means 50. This reading is an accurate and essentially instantaneous reading of the RMS voltage being supplied to the system which is particularly useful in providing a visual indication of system alarm conditions. In a preferred embodiment, a readout of the voltages for each phase, corrected in a manner set forth hereinabove, is provided by the processing means 46 and displayed in display means 50. It should be noted that the display means 50 is of conventional design (such as the Hitachi LM018 LCD display,) and provides a record and display of the approximate three phase RMS voltages and the apparent and actual power being consumed in the polyphase system. In essence, the circuit portion of the apparatus 10 shown in FIG. 1 provides for high speed RMS scanning utilizing only one RMS to DC converter chip.

In accordance with a further feature of the invention, processor means 46 multiplies the corrected voltage and the current readings for each phase and provides a signal proportional to the sum of the products which represents the apparent power consumed by the system for each phase of the polyphase input. The processor means 46 is also programmed to provide a signal which is proportional to the sum of the product of the in-phase components of the current and voltages in each of the phases of the electrical system being measured. As noted hereinabove, circuit 51 provides a reading of the actual kilowatts consumed by the system, this signal being applied to multiplexor 40 via lead 52. This input is correspondingly scanned by multiplexor 40 under control of processor means 46, converted to a digital signal by converter 44 and compared with the apparent power measurement set forth hereinabove in a manner such that a power factor representing the ratio of the actual kilowatts to the apparent power (divided by 1000) being consumed is provided, the ratio being displayed via display means 50. The power factor is a useful indication to system users, whereby the cables and other equipment utilized in their system can be configured in a manner such that the system operates at its maximum efficiency i.e. a power factor reading of close to unity.

Referring now to FIG. 2, a circuit 51 for measuring the actual kilowatts consumed in the system is illustrated. In particular, the particular voltages detected on leads 16,17, and 19, of FIG. 1 are also coupled to the inputs of multiplexor 14, multiplexor 14 in the embodiment illustrated being identical to multiplexor 12. In addition, the voltage outputs of current transformers CT1, CT2 and CT3, proportional to system currents $i_A$, $i_B$, and $i_C$, respectfully, are also coupled to multiplexor 14. The input scanning sequence of multiplexor 14 is controlled by processor means 46 via signals from ouptut port A which is applied to multiplexor address lines 80, 82 and 84. The output signals corresponding to the system voltages are applied to a voltage scaling device 90 via lead 92, the output of device 90 being applied to the "X" input of an analog multiplier 94, such as the Analog Devices AD534 chip, via lead 96. Similarly, the outputs of multiplexor 14 corresponding to the system currents are applied to current scaling devices 98 via lead 100, the output of device 98 being applied to the "Y" input of analog multiplier 94 via lead 102. The gain, or scaling devices 90 and 98 are identical and comprise operational amplifiers 104 and 105, grounded resistors 106 and 107 and digital gain sets 108 and 109. Typical of the digital gain sets which can be utilized include the LF13006 digital gain set manufactured by National Semiconductor Corporation.

Voltage and current gain selection values settings of both gain set devices 108 and 109 are controlled by the processing means 46 via output port A, the signals from the port being applied to the digital gain sets 108 and 109 via lead pairs 110 and 112, respectively. In essence, devices 90 and 98 enable a single step-down transformer to be utilized to couple the voltages/currents applied to the system (and thus to the apparatus of the present invention) by scaling down the voltages and currents to conform to the operating ranges of the circuitry in device 51. The gain settings are preset and, in the preferred embodiment, are based upon the type of mechanical program jumpers coupled to the parallel input port (see FIG. 3). The jumper selected is determined by the capacity of the customer power installation and is constant once such determination is made. Thus by selecting the appropriate jumper to correspond to the current/voltage transformers utilized the apparatus of the present invention, the microprocessor utilized in processor 46 can properly scale the readings in a simple manner without the necessity of mechanical changing the scale settings depending upon the capacity of the machine being installed. The processor means 46, upon initialization, reads the jumpers via the microprocessor and adjusts the voltage and current gain settings based on the setting of the jumpers; the jumpers also determine what the readings from A-D convertor 44 really mean. In particular, the output from convertor 44 is in the number range from 0 to 4096 based on the magnitude of the voltage at its input; the micrprocessor is able to determine that the voltage input to the A-D convertor, although scaled to 4 volts for example, actually represents 205 volts, the jumper thus providing the microprocessor with the required conversion factor. It should be noted that the settings could be set to a fixed valve and, for different sized installations, adjusted by replacing the scaling resistors utilized in gain sets 108 and 109. The output of analog multiplier 94 is coupled to a low pass filter 114 of conventional design (typically comprising resistors 116, 118 and 120; capacitors 122, 124 and 126; and operational amplifier 128) the output thereof being applied to lead 52 which, as shown as FIG. 1, is coupled to multiplexor 40.

In operation, the multiplexor 14 is sequenced in a manner such that the voltage signals corresponding to the particular phase being measured are simultaneously presented to the analog multiplier 94 via leads 96 and 102. The input thus to low pass filter 114 is an analog signal having an amplitude which is proportional to the product of the in-phase components of the current and voltage in the particular phase being measured. This output, appearing on lead 130, is the instantaneous value of the power consumed in the system for the particular phase being examined. The instantaneous output appearing on lead 130 is then coupled to low pass filter 114 which provides a signal on lead 52 representing the average value of the power for each of the phases of the electrical system being measured. Since all sequencing operations of the multiplexors shown in FIGS. 1 and 2 are controlled by the same processing means 46, the sequencing is coordinated such that the correct power factor as defined hereinabove is provided to display means 50. The circuit 51, in essence, provides a three phase kilowatt metering arrangement which utilizes time share multiplexing of multiplier 94.

Figure 3:
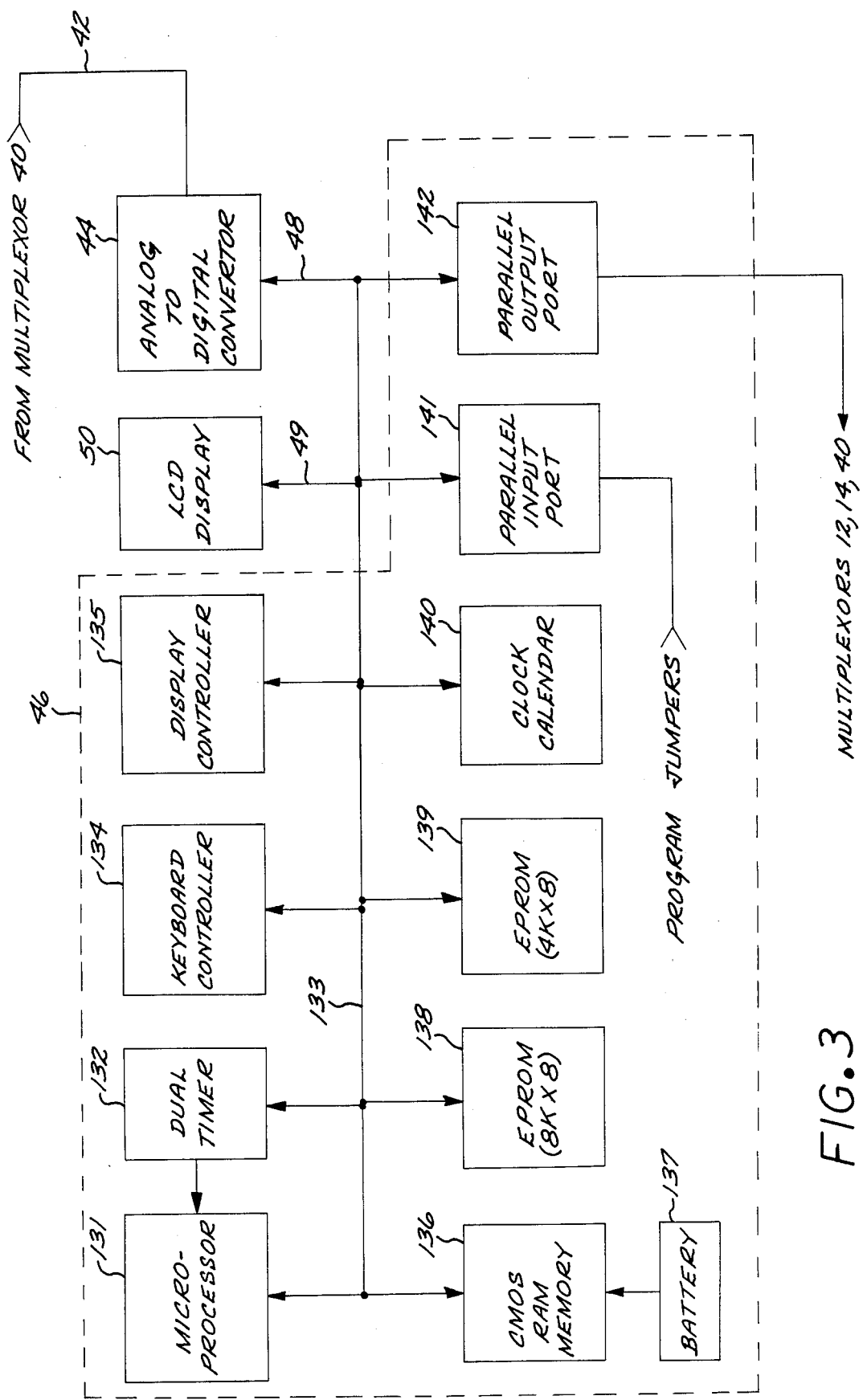
FIG. 3 is a simplified block diagram of the processor, or control system, utilized in the present invention.

FIG. 3 is a block diagram of the preferred embodiment of processor means 46. The components shown are typically mounted to the same printed circuit board (for definitional purposes, analog to digital converter 44 is illustrated as being not part of processor 46. However, this component is typically mounted on the same board as the other components illustrated, other than LCD display 50).

The components of the processor means 46 comprise a microprocessor 131, such as the Hitachi HD64B180 microprocessor chip; dual timer 132, such as the RCA 74HC423 timing chip timer; bi-directional data bus 133 whereby the microprocessor 131 can request information from any component connected thereto, the selected component then placing the requested information on bus 133 whereupon micrprocessor 131 reads the information; a keyboard controller 134, such as the National 74C923 controller board (although shown in the figure for the sake of completeness, the component and its keyboard is not discussed since it is not considered part of the invention); display controller 135, such as the National 74C912 controller, for controlling display 50 (this controller is conventional and is typical of the control device required to interface a microprocessor and the system display); CMOS RAM memory 136, such as the Hitachi 6264LP memory chip; battery 137; EPROM memories 138 (Hitachi 27256 chip) and 139 (Hitachi 27128 chip); clock calendar 140, such as the National 58167; parallel input port 141, such as the RCA 74HCT373 input port chip; and parallel output port 142, such as the RCA 74HCT374 output port chip, the output of this chip being coupled to multiplexors 12, 14 and 40.

Upon initialization of the processor means 46 whereby the mircroprocessor 131 is powered on, the program jumpers are read and the gain settings for devices 108 and 109 are set. During operation of the apparatus and as is set forth in more detail with reference to the flow charts of FIGS. 4–6; miocroprocessor 131 reads information from analog to digital convertor 44, processes the information and sends it to display 50 via bus 133.

Referring now to FIGS. 4A and 4B, the actual kilowatt and apparent power metering flow-charts, respectively, are illustrated. The flow charts (and the flow charts shown in FIGS. 5 and 6) are set forth to enable a computer programmer to program the Hitachi microprocessor 131 set forth hereinabove in a manner such that the multiplexors and gain setting devices are controlled as disclosed and the appropriate correction and power factor calculations can be generated. It should be noted that the other operations of the processor means 46 and the associated display board are not considered to be part of the present invention.

Symbol 150 represents the appropriate selection of the voltage and current gains of digital gain sets 108 and 109, respectively. The actual setting depends upon the apparatus being utilized and can easily be calculated from the system perameters as set forth hereinabove. At initialization, an index n in the microprocessor is initially set to 1. The values selected are coupled to the gain set chips 108 and 109 via voltage pairs 110 and 112, respectfully, as represented by symbol 152. The microprocessor is programmed to then select the first (i.e. voltage $V_A$ and $i_A$) voltage and current phase by applying the appropriate address code on leads 80, 82 and 84 which are coupled to multiplexor 14 (represented by symbol 154). The output from the selected phase is delayed an appropriate time, such as 50 milliseconds, as illustrated by symbol 156, and the voltage and current for that phase is read via multiplexor 40 by signals applied to the address ports of multiplexor 40 from output port A. This data is applied to A-D converter 44 and stored in the memory devices 138 and 139 which form part of the processor means 46 in which microprocessor chip 131 is also a part (symbol 158). If the microprocessor determines that n is less than 3 (symbol 160), the index n is incremented by 1 (symbol 162) and the above process is repeated. If index n is equal to 3 (corresponding to a three phase power system), the microprocessor 131 causes the prior three phase readings to be added (symbol 164) to obtain the total kilowatts consumed by the system. The index is then reset to 1 (symbol 166) and the above process is repeated to thus obtain a continuous reading of the power being consumed by the system. A similar process is performed to measure apparent power (KVA) consumed by the system as illustrated by the flowchart of FIG. 4B. The index is set to 1 (symbol 168) and microprocessor 131 selects the first voltage phase by applying the appropriate address code on leads 22, 24 and 26 which are coupled to multiplexor 12 (represented by symbol 170). The output from the selected phase is delayed an appropriate time, such as 50 milliseconds, as illustrated by symbol 172, and the voltage for that phase is read via multiplexor 40 by signals applied to the address ports of multiplexor 40 from output port A. This data is applied to A-D convertor 44 and stored in the memory devices 138 and 139 which form part of the processor means 46 in which microprocessor chip 131 is also a part (symbol 174). The corresponding current phase is then selected (symbol 176) and the output from the selected phase is delayed an appropriate time, such as 50 milliseconds, as illustrated by symbol 178, and the current for that phase is read on convertor 44 from multiplexor 40 and stored (symbol 180). The apparent power (KVA) for that phase (voltage times current divided by 1000) is then calculated (symbol 181). If the index n is less than 3 (symbol 182), the index is incremented by 1 (symbol 183) and the process is repeated. If the index equals 3, the total KVA is calculated by adding the KVA for each phase (symbol 184) to thus obtain a continuous reading of the apparent power being consumed by the system. The KVA result is divided by the actual kilowatt reading (symbol 164, FIG. 4A) to obtain the power factor (symbol 185) and the index is reset to 1 (symbol 168).

Figures 5, 6:
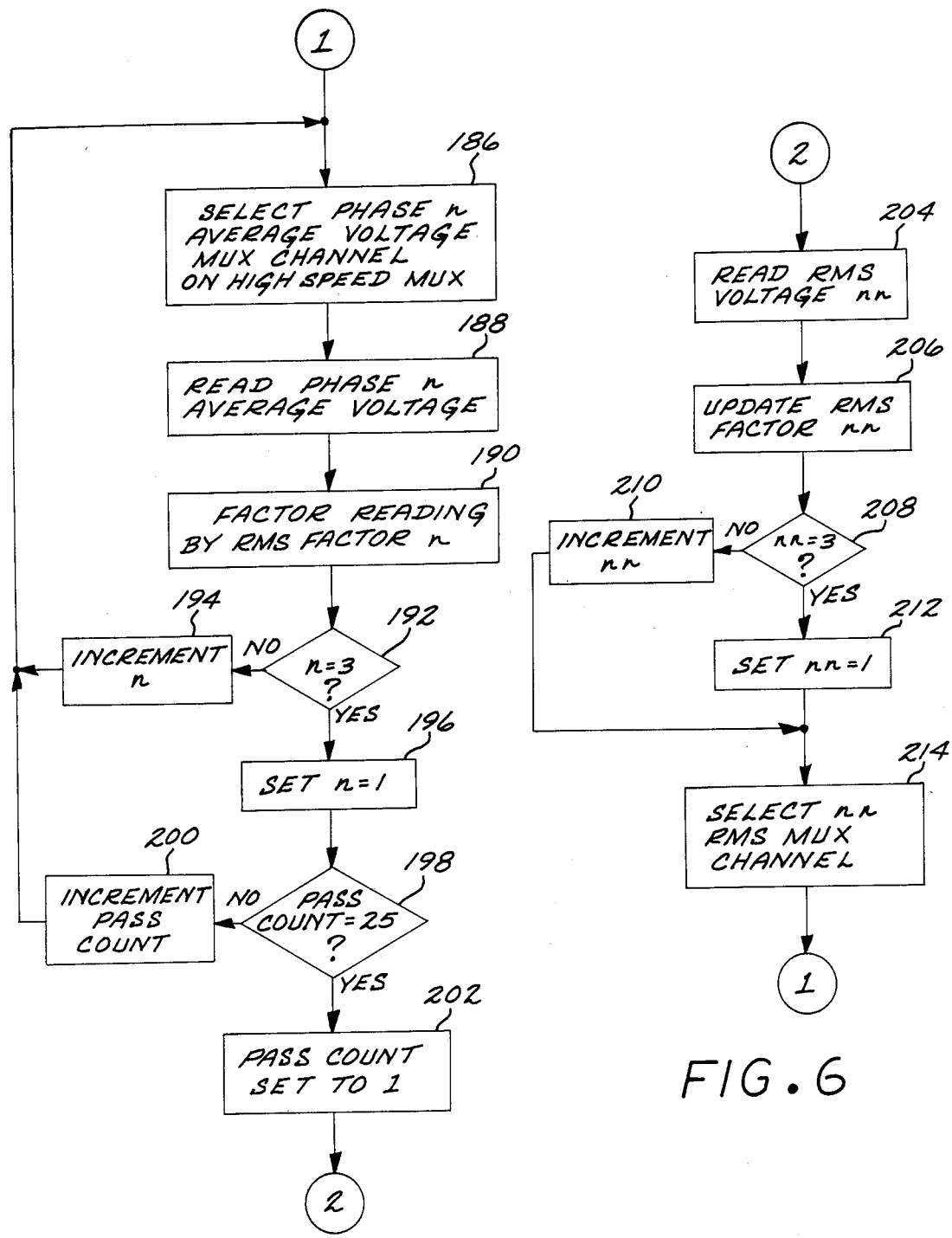

The flowchart shown in FIG. 5 refers, in essence, to the operation of the circuit shown in FIG. 1. Initially, the particular phase (phase A, B or C) of the average voltage applied to multiplexor 40 via leads 70, 72 and 74, respectfully, is selected for readout via the signals applied to terminals A, B, and C (symbol 186). Then the selected average voltage is readout (symbol 188). This reading is then multiplied by the correction (RMS) factor stored in the microcomputer memory (symbol 190) to provide an approximate RMS voltage reading. If each of the three phase voltages have not been read (n<3) as determined by symbol 192, the index counter n is incremented by 1 (symbol 196) and the process repeats until the three phases have been read at least once (n=3), the three phase average voltages in the high speed loop thus having been read. At this time, n is set to 1 (symbol 196) and the program determines the number of times the three phase voltages have been read (pass count). If the pass count is less than 25, for example (selected to provide approximately 300 milliseconds of reading average voltages since the last RMS multiplexor selection, thus allowing sufficient delay for the accurate reading from RMS/DC converter 32), the pass counter is incremented (symbol 200) and the program returned to the initial start point. If the pass count equals 25, the pass count is set to 1 (symbol 202) and the program passes to the flow chart shown in FIG. 6. In this figure, the RMS voltage at the output of convertor 32 for a selected phase is read (symbol 204), compared with the last average voltage reading, the latter value being divided into the former to provide the correction factor, and the previous stored RMS factor for that phase is updated (symbol 206). If the nn index counter is less than 3 (symbol 208), this counter is incremented by 1 (symbol 210) and the next sequential channel from RMS multiplexor 12 is selected (symbol 214) and program control is returned to the portion of the program represented by the flow chart shown in FIG. 5. If the nn index counter is equal to 3, this counter is reset to 1 (symbol 212), the first channel of multiplexor 12 is selected (symbol 214) and program control is again returned to the program represented by the flow chart shown in FIG. 5.

The present invention thus utilizes the concepts of time sharing and microprocessor programming to provide an apparatus which measures power in a more cost effective, quicker and accurate manner than heretofore provided by currently available power measurement apparatus. The time sharing aspect of the invention in essence reduces the number of relatively costly RMS converter chips necessary for the apparatus to perform its function i.e. only one is necessary compared to the usual three identical circuits or chips necessary in prior art polyphase power measurement apparatus. Further, the use of the voltage/current scaling devices instead of the plurality of costly transformers normally utilized to stepdown the voltages/currents received from the initial power distribution source further reduces the cost of the apparatus.

While the invention has been described with reference to its preferred embodiments, it will understood by those skilled in the art that various changes may be made and equivalents may be substituted for elements thereof without departing from the true spirit and scope of the invention. In addition, many modifications may be made to adapt a particular situation or material to the teachings of the invention without departing from its essential teachings.

What is claimed is:

1. Apparatus for measuring electrical power consumed in an electrical system comprising:
   means for generating at least a first signal representing an ac voltage provided to said system and at least a second signal representing an ac current provided to said system;
   first multiplexor means responsive to said first signal and said second signal, said first and second signals appearing at the output of said first multiplexor means in a controlled sequence;
   first means coupled to the output of said first multiplexor means for converting the controlled sequence signals at said multiplexor output to corresponding dc signals;
   second means coupled to said first converting means for converting said dc signals to digital signals; and
   means responsive to said digital signals for providing a third signals representing the product of said first and second signals, said third signal representing the apparent power provided to said system by said ac current and voltage signals.

2. The apparatus of claim 1 wherein said providing means comprises processor means.

3. The apparatus of claim 2 wherein said processor means comprises a microprocessor.

4. The apparatus of claim 2 wherein said processor means controls the input scanning sequencing of said first multiplexor means.

5. The apparatus of claim 4 further including second multiplexor means having a controlled input scanning sequence interposed between said first converter means and said second converter means, the input scanning sequencing of said second multiplexor means being under the control of said processor means.

6. The apparatus of claim 5 further including means responsive to said voltage providing means for generating an average value thereof, the output of said generating means being coupled to said second multiplexor means.

7. The apparatus of claim 6 wherein the output of said generating means is scanned a plurality of times for each single scan of the output of said first converter means.

8. The apparatus of claim 7 further including means for displaying said third signal produced by said processor means.

9. The apparatus of claim 6 wherein the voltage output of said averaging means is coupled to said processor means, said processor means providing a ratio of said average value and said dc voltage signal, said average value being periodically corrected by said ratio and thereafter being displayed by said display means.

10. The apparatus of claim 9 further including third multiplexor means responsive to said first signal and said second signal, the sequential input scanning of said third multiplexor means being under the control of said processor means.

11. The apparatus of claim 10 further including multiplier means coupled to the outputs of said third multiplexor means for generating an analog signal representing the instantaneous product of said first and second signals, said multiplier means having an output.

12. The apparatus of claim 11 wherein the output of said multiplier means is coupled to filter means, the output of said filter means representing the actual power being consumed by said system.

13. The apparatus of claim 12 wherein the output of said filter means is coupled to said second multiplexor means.

14. The apparatus of claim 13 wherein an apparent and actual power input signals to said second multiplexor means are coupled to said processor means, said processor means providing a signal representing a ratio of said apparent and actual power signals and a signal proportional to said apparent power signal.

15. The apparatus of claim 14 wherein said processor means causes said power signal ratio to be displayed by said display means.

16. The apparatus of claim 15 further including scaling means coupled between said third multiplexor means and said multiplier means wherein the magnitude of the voltage and current signals at the output of said third multiplexor means are adjusted to a predetermined value.

17. The apparatus of claim 16 wherein said scaling means is controlled by said processor means.

18. Apparatus for measuring electrical power consumed in a polyphase electrical system comprising:
   means for generating first, second and third analog signals representing ac voltages and fourth, fifth and sixth analog signals representing ac currents;
   first multiplexor means responsive to said first, second and third analog signals representing ac voltages provided to said system and to said fourth, fifth and sixth analog signals representing ac currents provided to said system, all said analog signals appearing at the output of said first multiplexor means in a controlled sequence;
   first means coupled to the output of said first multiplexor means for converting the signals at said multiplexor output to dc signals,
   second means coupled to said first converting means for converting said analog signals to corresponding digital signals; and
   means responsive to said digital signals for providing a seventh signal representing a sum of products of said first and fourth analog signals, said second and fifth analog signals and said third and sixth analog signals, said seventh analog signal representing the apparent power consumed by said system.

19. The apparatus of claim 18 wherein said providing means comprises processor means.

20. The apparatus of claim 19 wherein said processor means comprises a microprocessor.

21. The apparatus of claim 19 wherein said processor means controls the input scanning sequencing of said first multiplexor means.

22. The apparatus of claim 21 further including second multiplexor means having an input scanning sequence interposed between said first converter means and said second converter means, the input scanning sequencing of said multiplexor means being under the control of said processor means.

23. The apparatus of claim 22 further including means responsive to said voltage providing means for generating an average value of said first, second and third analog voltage signals, the output each of said generating means being coupled to said second multiplexor means.

24. The apparatus each of claim 23 wherein the output of said generating means is scanned a plurality of times for each single scan of the output of said first converter means.

25. The apparatus of claim 24 further including means for displaying signals produced by said processor means.

26. The apparatus of claim 24 wherein the voltage outputs of said averaging means are coupled to said processor means, said processor means providing a ratio of said average values and one of said dc voltage signals, each of said average values being periodically corrected by said ratio and thereafter being displayed by said display means.

27. The apparatus of claim 26 further including third multiplexor means responsive to said voltage and current signals, the sequential input scanning of said third multiplexor means being under the control of said processor means, said third multiplexor having an output.

28. The apparatus of claim 27 further including multiplier means coupled to the output of said third multiplexor means for generating an analog signal representing the instantaneous product of said first and fourth, second and fifth, and said third and sixth analog signals.

29. The apparatus of claim 28 wherein the outputs of said multiplexor means are coupled to filter means, the output of said filter means representing the actual power being consumed by said system.

30. The apparatus of claim 29 wherein the output of said filter means is coupled to said second multiplexor means.

31. The apparatus of claim 28 further including scaling means coupled between said third multiplexor means and said multiplier means wherein the magnitude of the voltage and current signals at the output of said third multiplexor means are adjusted to a predetermined value.

32. The apparatus of claim 31 wherein said scaling means is controlled by said processor means.

33. Apparatus for measuring the instantaneous electrical power consumed in a polyphase electrical system comprising:

means for providing first, second and third analog signals representing instantaneous ac voltage and fourth, fifth and sixth signals representing instantaneous current signals supplied to said system;

multiplexor means responsive to said analog signals;

processor means for controlling the sequential input scanning of said multiplexor means;

multiplier means coupled to the output of said multiplexor means for generating in sequence analog signals representing the instantaneous product of said first and fourth, said second and fifth, and said third and sixth analog signals;

filter means coupled to said multiplier means and responsive to said sequential analog signals; and means for coupling the output of said filter means to said processor means, the analog product signals being summed by said processor means to provide a signal representing the actual power being consumed in said system.

34. The apparatus of claim 33 further including display means coupled to said processor means, the signal representing actual power being displayed by said display means.

35. The apparatus of claim 33 further including scaling means coupled between said multiplexor means and said multiplier means wherein the magnitude of the signals at the output of said multiplexor means are adjusted to a predetermined value.

36. The apparatus of claim 35 wherein said scaling means is controlled by said processor means.

* * * * *